(12) United States Patent
Slaton et al.

(10) Patent No.: US 8,347,502 B2
(45) Date of Patent: Jan. 8, 2013

(54) HEAT SINK AND METHOD OF FORMING A HEATSINK USING A WEDGE-LOCK SYSTEM

(75) Inventors: David S. Slaton, Huntsville, AL (US); David L. McDonald, Lacey's Spring, AL (US)

(73) Assignee: GE Intelligent Platforms, Inc., Charlottesville, VA (US)

( * ) Notice: Subject to any disclaimer, the term of this patent is extended or adjusted under 35 U.S.C. 154(b) by 853 days.

(21) Appl. No.: 11/966,201

(22) Filed: Dec. 28, 2007

(65) Prior Publication Data
US 2009/0166021 A1   Jul. 2, 2009

(51) Int. Cl.
*B21D 53/02* (2006.01)
(52) U.S. Cl. .................... 29/890.03; 165/80.3
(58) Field of Classification Search ............... 29/890.03, 29/890.32; 165/80.3; 257/E23.088
See application file for complete search history.

(56) References Cited

U.S. PATENT DOCUMENTS

| | | | | |
|---|---|---|---|---|
| 3,573,707 A | * | 4/1971 | Reynolds | 174/263 |
| 4,507,034 A | | 3/1985 | Lew et al. | |
| 5,316,080 A | | 5/1994 | Banks et al. | |
| 5,969,949 A | | 10/1999 | Kim et al. | |
| 5,969,950 A | | 10/1999 | Tantoush | |
| 7,220,485 B2 | * | 5/2007 | Sayir et al. | 428/408 |
| 7,539,019 B2 | * | 5/2009 | Wayman et al. | 361/710 |
| 7,567,438 B1 | * | 7/2009 | Barsun et al. | 361/709 |
| 7,898,807 B2 | * | 3/2011 | Beaupre et al. | 361/699 |
| 7,901,509 B2 | * | 3/2011 | Mariner et al. | 118/715 |
| 8,051,896 B2 | * | 11/2011 | Wayman | 165/80.3 |
| 2002/0096313 A1 | | 7/2002 | Graf et al. | |
| 2003/0203181 A1 | | 10/2003 | Ellsworth | |
| 2004/0033105 A1 | | 2/2004 | North | |
| 2005/0006054 A1 | | 1/2005 | Miyazaki et al. | |
| 2005/0064230 A1 | | 3/2005 | Sayir et al. | |
| 2005/0067178 A1 | * | 3/2005 | Pearson et al. | 174/52.4 |
| 2005/0189568 A1 | | 9/2005 | Colgan et al. | |
| 2006/0035085 A1 | | 2/2006 | Ozaki et al. | |
| 2007/0053168 A1 | * | 3/2007 | Sayir et al. | 361/718 |
| 2007/0188993 A1 | | 8/2007 | Gallina | |
| 2009/0165302 A1 | * | 7/2009 | Slaton et al. | 29/890.054 |
| 2010/0326645 A1 | * | 12/2010 | Fan et al. | 165/185 |

FOREIGN PATENT DOCUMENTS

| | | |
|---|---|---|
| EP | 0125683 A | 11/1984 |
| WO | 2005/050738 A | 6/2005 |

OTHER PUBLICATIONS

WO Search Report issued in connection with corresponding WO Patent Application No. US08/83645 filed Nov. 14, 2008.

* cited by examiner

*Primary Examiner* — Alexander P Taousakis
(74) *Attorney, Agent, or Firm* — GE Global Patent Operation; Catherine J. Toppin

(57) ABSTRACT

The present disclosure is related to a heatsink and a method for forming a heatsink. In one embodiment, a method for forming the heatsink includes forming at least one thermo pyrolytic graphite element. The at least one TPG element includes a first side having a wedge-shaped surface and a second side having a flat surface. The method further includes layering a metal material over the at least one TPG element, the metal configured to be complementary to the first side of the at least one TPG element, and applying pressure to fasten the metal material to the at least one TPG element.

4 Claims, 3 Drawing Sheets

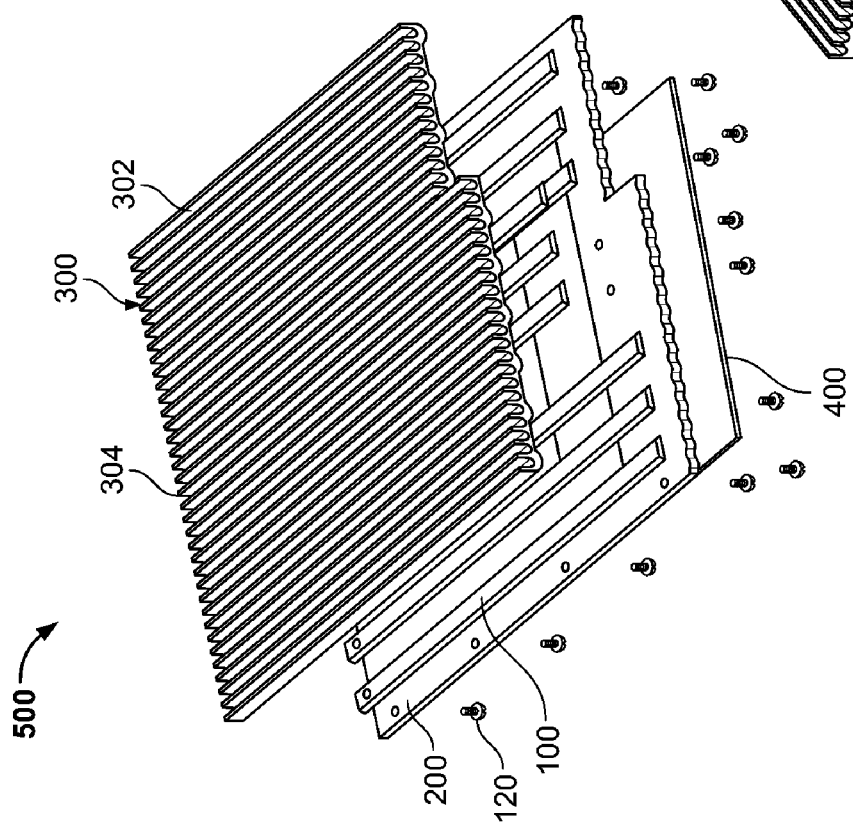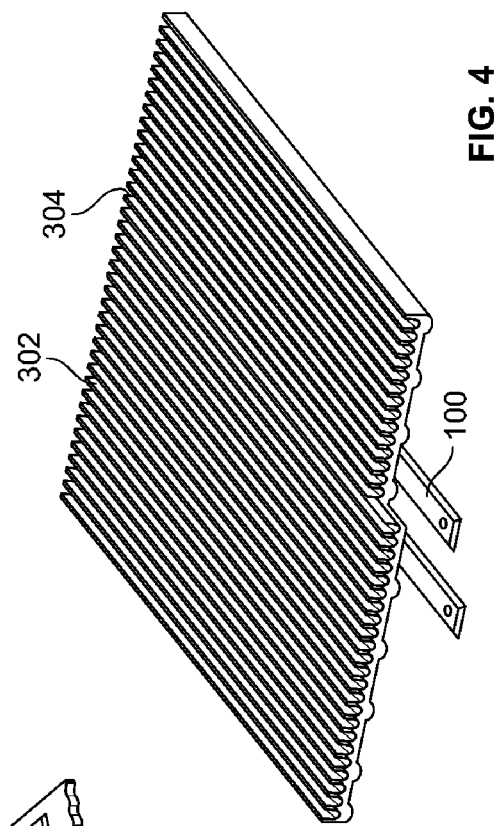

HEAT SINK AND METHOD OF FORMING A HEATSINK USING A WEDGE-LOCK SYSTEM

BACKGROUND OF THE INVENTION

This disclosure relates generally to methods of fastening thermo pyrolytic graphite (TPG) to metal materials to serve as heatsinks for various uses and, more particularly, to releasably fastening TPG elements to a metal material using a wedge-lock system to form a heatsink.

Modern embedded computer systems contain very high thermal power electrical components in a volumetrically constrained environment. The volumes typically do not change as the power dissipation of the components increase, presenting significant challenges in the management of component temperatures. In the past, a variety of direct cooling techniques such as active or passive heatsinks composed of high thermally conductive materials such as aluminum and/or copper have been used to manage rising temperatures. These materials, however, are only sufficient if a relatively large amount of surface area is presented to the airstream, necessitating a physically larger heatsink structure that occupies a large amount of the total available volume. As the physical size of the heatsink increases, the ability of the material to rapidly carry heat to the extremities of the heatsink, thereby exposing the heat to the airstream, is diminished.

Thermo Pyrolytic Graphite (TPG) materials have been found to have the ability to provide better heat conduction in a single (X-Y) plane as compared to conventional metal materials. Furthermore, TPG has been found to have an improved overall conductivity as compared to copper. Recently, a method has been developed to embed TPG into an aluminum structure using a diffusion bonding process. The diffusion bonding process, while resulting in a very good thermal contact between the TPG material and the aluminum structure, has limitations in that specialized equipment is needed to create the TPG-embedded structures in a time-consuming process, resulting in an expensive product.

As such, there is a need for a method to create a cost-effective product having TPG fastened to a metal material, such as an aluminum structure, to form a metal heat-conducting structure (i.e., heatsink) to provide effective thermal conductivity in the X-Y plane. Additionally, it would be advantageous if the method were easily reproducible and could be performed in many various facilities using many various types of equipment.

BRIEF DESCRIPTION OF THE INVENTION

In one aspect, a method for forming a heatsink is provided. The method includes forming at least one TPG element, wherein the at least one TPG element has a first side having a wedge-shaped surface and a second side having a flat surface; layering a metal material over the at least one TPG element, wherein the metal material is configured to be complementary to the first side of the at least one TPG element; and applying pressure to fasten the metal material to the at least one TPG element.

In another aspect, a method for forming a heatsink is provided. The method includes forming at least one hole through at least one TPG element, wherein the at least one TPG element is configured to be complementary to at least one expandable bushing; forming at least one hole through a metal material, the at least one hole being configured larger than the at least one expandable bushing; and inserting the at least one expandable bushing into the at least one hole in the metal material using a fastener.

In yet another aspect, a heatsink is provided. The heatsink includes at least one TPG element comprising a first side having a wedge-shaped surface and a second side having a flat surface. Additionally, the heatsink includes a metal material coupled to the first side of the at least one TPG element.

In yet another aspect, a heatsink is provided. The heatsink includes at least one TPG element, the at least one TPG element having a first side having at least one hole through the at least one TPG element; and a metal material coupled to an inner surface of the at least one hole in the at least one TPG element. The at least one TPG element is configured to be complementary to at least one expandable bushing.

BRIEF DESCRIPTION OF THE DRAWINGS

FIG. 3 depicts an exploded view of an exemplary heatsink formed using an exemplary method according to the present disclosure.

FIG. 4 depicts a perspective view of a metal fin assembly positioned over a TPG element according the method of FIG. 3.

DETAILED DESCRIPTION OF THE INVENTION

The present disclosure is related to fastening thermo pyrolytic graphite (TPG) to a metal material for forming heatsinks. As used herein, "TPG" refers to any graphite-based material in which the graphite is aligned in one direction for optimal heat transfer. The materials are typically referred to as "aligned graphite", "TPG", and "Highly Oriented Pyrolytic Graphite (HOPG)". The TPG elements provide improved thermal conductivity in the X-Y plane of the heatsink. More specifically, it has been found that by using the methods of fastening TPG elements to a metal material as provided in the present disclosure, temperatures created by the use of electrical systems, such as computer systems, can be lowered by about 10° C. or more as compared to conventional thermal solutions. This improved temperature release allows for almost a doubling of the electrical systems' power capacity in the same volume environment. Furthermore, the increase in power may result in systems being supported that could not have otherwise been so, or may allow existing systems to be used in environments having higher ambient temperatures.

As noted above, the heatsink is formed by fastening TPG to a metal material. TPG elements can be obtained using any suitable method and/or equipment known in the art for fabricating TPG elements and guided by the teachings herein provided. The TPG elements can further be obtained commercially from suppliers, such as Momentive Performance Material located in Wilton, Conn.

More specifically, the method generally includes forming at least one wedge-shaped TPG element. A metal material is layered over the wedge-shaped TPG element, and configured to be complementary to a wedge-shaped surface side of the TPG element. Pressure is applied to fasten the metal material to the wedge-shaped TPG element.

Figure 1:
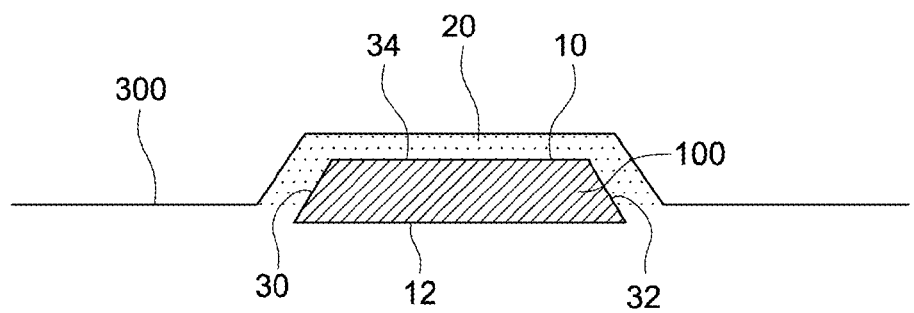
FIG. 1 depicts a TPG element and a metal material to be fastened according to an exemplary method of the present disclosure.

As shown in FIG. 1, a TPG element 100 is configured to be a wedge-shaped element. More specifically, the wedge-shaped TPG element 100 includes a strip having a first side 10 having a wedge-shaped surface and a second side 12 having a flat surface. As shown in FIG. 1, the first side 10 of the TPG element 100 is tapered on opposing first surface 30 and second surface 32 at approximately a 45 degree angle with respect to an intermediate surface 34. While shown in FIG. 1, as being opposing surfaces, it should be recognized by one skilled in the art that first surface 30 and second surface 32 can be is in direct contact with one another without departing from the scope of the present disclosure.

Figure 2:
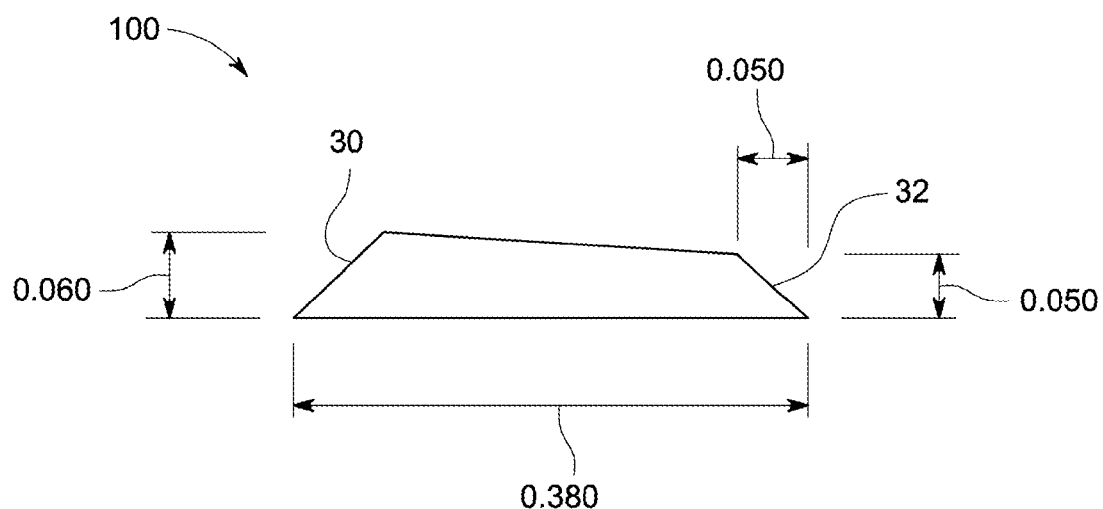
FIG. 2 depicts an end of the TPG element of FIG. 1.

In a particular embodiment, as shown in FIG. 2, the wedge-shaped TPG element 100 has a thickness at or near first surface 30 different than a thickness at or near second surface 32. Without being limiting, as shown in FIG. 2, first surface 30 has a thickness of approximately 0.060 inches, while second surface 32 has a thickness of approximately 0.050 inches. While shown in FIG. 2 as having different thicknesses, it should be understood by one skilled in the art that the thickness at or near first surface 30 can be equal to the thickness at or near second surface 32 without departing from the scope of the disclosure. It should be noted that the thickness of wedge-shaped TPG element 100 may vary from one surface 30 to the opposing surface 32 (or does not vary), but a width of first surface 30 and a width of second surface 32 may still be equal. Furthermore, it should be understood that first surface 30 may be thinner than the second surface 32. It should also be recognized that more than one surface (i.e., first surface 30) can be wedge-shaped without departing from the scope of the present disclosure.

While one or more dimensions of TPG element 100 may vary, TPG element 100 in one embodiment has a thickness of approximately from about 0.05 inches to about 0.06 inches.

At least one TPG element 100 is formed for use in the method of the present disclosure. Dimensions of TPG element 100, a number of TPG elements 100 and/or spacing between adjacent TPG elements 100 will depend on the desired end product. Typically, however, it is suitable to use more than one TPG element 100 to form the heatsink (indicated in FIG. 3 at 500).

Figure 5:
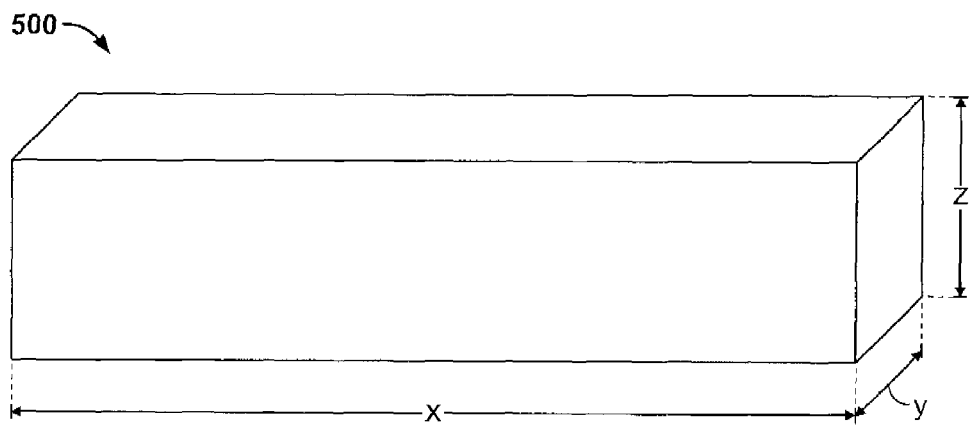
FIG. 5 depicts an X-plane, a Y-plane, and a Z-plane of thermal conductivity in a heatsink.

As noted above, the method further includes layering a metal material 300 to one or more TPG elements 100. Metal material 300 is typically made from a material having a high thermal conductivity. For example, metal material 300 includes aluminum and/or copper. In one embodiment, metal material 300 is aluminum. Both aluminum and copper have been shown to provide high conductivity when used in heatsinks. More specifically, aluminum provides good thermal conductivity in the "Z" plane (shown in FIG. 5) when used in heatsinks. However, as noted above, aluminum and copper alone fail to provide sufficient heat transfer in the X-Y plane and, as such, the present disclosure has combined TPG with aluminum and/or copper.

In one embodiment, metal material 300 is configured to be complementary to first side 10 of TPG element 100. More specifically, as shown in FIG. 1, metal material 300 is layered or positioned over first side 10 of TPG element 100. This configuration allows for a locking fastening system as described more fully below.

In one embodiment, as shown in FIG. 3, metal material 300 includes a metal fin assembly 302. Metal fin assembly 302 provides greater surface area for thermally conduction, thereby facilitating a more efficient and effective heat release from a heat source element (not shown), such as an integrated semiconductor circuit, like a CPU, or the like. In a particular embodiment, metal fin assembly 302 is approximately 6 inches×5 inches and is approximately 0.3 inches in thickness. Fin assembly 302, in one embodiment, includes a plurality of fins 304, each approximately 0.24 inches in height and approximately 0.024 inches thick. A spacing between adjacent fins 304 of fin assembly 302 is approximately 0.096 inches. It should be understood by one skilled in the art that fins 304 of metal fin assembly 302 can be sized and spaced other than as described above without departing from the scope of the present disclosure.

In an alternative embodiment, metal material 300 is a conduction-cooled heatframe (not shown) intended to transfer heat to one or more edges of the heatframe which it interfaces with a cold wall, instead of with the air. Conduction-cooled heatframes are known in the art and can be commercially supplied, such as from the commercial supplier Simon Industries located in Morrisville, N.C.

In addition to TPG element 100 and metal material 300, in some embodiments (such as shown in FIGS. 3 and 4), thermal spacer 400 is layered over the TPG element 100 (or a strip retention plate 200, when used) in such a configuration so that TPG element 100 is positioned between thermal spacer 400 and metal material 300. Thermal spacer 400 is used to couple a heat source element (not shown) to heatsink 500. Furthermore, thermal spacer 400 is capable of spreading the heat to the edges of metal material 300.

Typically, thermal spacer 400 is configured to be complementary to a heat source element, as described below. Thermal spacer 400 can be made from the same material or a different material than metal material 300 described above. Suitable materials for providing thermal spacers 400 include, for example, metal materials including aluminum and/or copper. In one embodiment, thermal spacer 400 is copper.

As noted above, thermal spacer 400 is typically configured to be complementary to a heat source element. Generally, the heat source element is an electrical heat source element, such as an integrated semiconductor circuit, or a CPU. As noted above, during use of the heat source element, such as a CPU, a large amount of heat is generated that must be released to the outside environment to prevent overheating and/or malfunctioning of the heat source element. For example, an integrated circuit may dissipate approximately 30 Watts or greater of thermal power, with die temperatures reaching an excess of about 100° C. This heat must be released to prevent overheating of the integrated circuit.

As shown in FIGS. 3 and 4, in one embodiment, once layered, TPG element(s) 100 and metal material 300 are coupled to strip retention plate 200. More specifically, the flat surface of second side 12, shown in FIG. 1, of TPG element 100 is coupled to a planar strip retention plate 200. By way of example, in one embodiment as shown in FIG. 3, TPG element 100 is attached to strip retention plate 200 using a mechanical coupling means, such as one or more screws 120. While shown in FIG. 3 as a screw, it should be understood by one skilled in the art that TPG element 100 may be coupled to strip retention plate 200 using any suitable mechanical coupling means known in the art.

Generally, strip retention plate 200 is provided to apply a force to TPG elements 100 against metal material 300, thereby minimizing the thermal interface between TPG elements 100 and metal material 300, and further, adding structural support and strength to heatsink 500.

Typically, strip retention plate 200 is made from aluminum and/or copper. In one embodiment, strip retention plate 200 is made from aluminum.

In one embodiment, the method of the present disclosure includes applying a metal-based coating material to first side 10 of TPG element 100. More specifically, when used, the metal-based coating material is typically applied to first side 10 of TPG element 100 facing towards metal material 300. A layer of metal, such as aluminum, copper, iron, silver, gold, nickel, zinc, tin, or a combination thereof, is applied to first side 10 of TPG element 100. In a particular embodiment, the metal-based coating material is a copper coating material with a nickel overcoat. In an alternative embodiment, a coating of indium is used as the metal-based coating material.

The metal-based coating material suitably provides mechanical strength. The metal-based coating material is typically at least about 0.001 inches thick. More suitably, the metal-based coating material has a thickness of from about 0.006 inches to about 0.025 inches.

The metal-based coating material can be applied to first side 10 of TPG element 100 in any suitable pattern known in the art. For example, in one embodiment, the metal-based coating material is applied in a cross-hatched pattern. In an alternative embodiment, the metal-based coating material is applied in a striped pattern.

In addition to the metal-based coating material, in one embodiment, the method includes applying a thermal interface material 20 to first side 10 of TPG element 100. More specifically, as shown in FIG. 1, the thermal interface material, generally indicated at 20, suitably is disposed between metal material 300 and TPG element 100. Thermal interface material 20 may be desired to reduce the thermal resistance between two components in heatsink 500, for example, between first side 10 of TPG element 100 and metal material 300. One exemplary suitable thermal interface material 20 is Bergquist TIC4000, commercially available from Bergquist located in Chanhassen, Minn.

The method of the present disclosure includes fastening TPG element 100 (and retention plate 200, when used) to metal material 300 (and, to thermal spacer 400, when used) to form heatsink 500. Suitably, TPG element 100 and metal material 300 are fastened to form heatsink 500 configured to facilitate conduction of heat from the heat source element to thermal spacer 400 (when used), and then through TPG element 100 and metal material 300 to the surrounding environment.

Suitably, the fastening step includes applying pressure to wedge-lock metal material 300 and TPG element 100 together. Pressure can be applied using any suitable means known in the art. The amount of pressure will typically depend upon the metal material used and the dimensions and/or number of TPG elements 100 to be locked together.

As noted above, TPG element 100 is releasably fastened to metal material 300 using the methods of the present disclosure. That is, the wedge-lock system used in the present disclosure for fastening allows the heatsink 500 to be disassembled and reassembled in a convenient and easy manner.

In one alternative embodiment, a thermally conductive adhesive (not shown) is further used to fasten TPG element 100 to metal material 300. Typically, the adhesive is applied to at least one of TPG element 100 and metal material 300, and thermal spacer 400 (when used). More specifically, the adhesive may generally be applied in a semi-solid state, such as in a paste, or gel-like form using any method known in the art.

In one embodiment, the thermally conductive adhesive is Arctic Silver Epoxy, commercially available from Arctic Silver, Inc., located in Visalia, Calif. Amounts of adhesive used will typically depend upon the specific heatsink configuration. In one embodiment, approximately 1.5 mL of adhesive is applied using a syringe and a spatula to spread the adhesive into a thin layer over TPG element 100, metal material 300, and thermal spacer 400.

Figure 6:
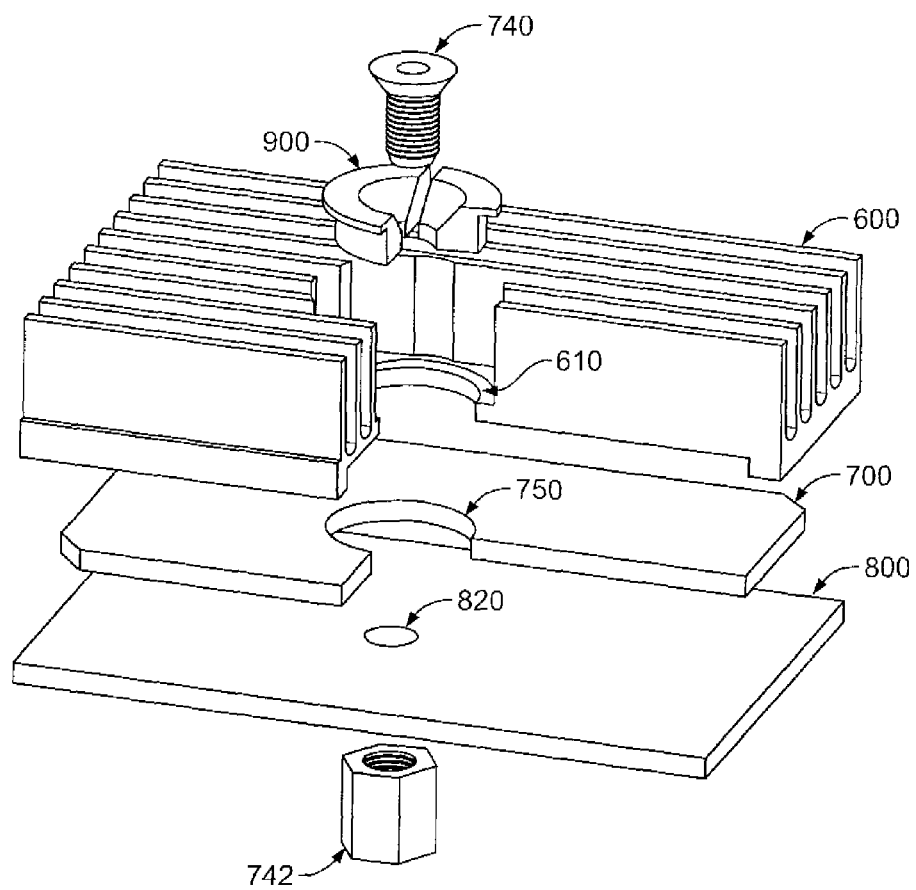
FIG. 6 depicts an exploded view of an exemplary heatsink formed using an exemplary method according to the present disclosure.

In another embodiment, as shown in FIG. 6, at least one TPG element 700 is configured to contain at least one hole 750 of a size complementary to an expandable bushing 900. As used herein, expandable bushing 900 can be any suitable expandable bushing known in the art. Furthermore, the specific method for expanding expandable bushing 900 may be any method known in the art for expanding expandable bushings 900. The size and/or dimensions of expandable bushing 900 will typically depend on the size of at least one hole 750 and the specific heatsink configuration and/or dimensions.

Additionally, metal material 600 contains at least one hole 610 sized sufficiently larger than hole 750 in TPG element 700 such that expandable bushing 900, when expanded, presses against the inner surfaces of TPG element 700 instead of metal material 600. The shape of expandable bushing 900 is such that its outer surfaces expand when a fastener 740 is inserted therein. In one embodiment, as shown in FIG. 6, a tapered screw 740 is inserted through expandable bushing 900. Furthermore, tapered screw 740 is inserted through expandable bushing 900, through retention plate 800 that has a hole 820 large enough to accept tapered screw 740, and into a nut 742. When tapered screw 740 is tightened, the outer surfaces (also referred to herein as walls) of expandable bushing 900 expand, pressing against the inner surfaces of TPG element 700, thereby reducing the thermal interface.

In one embodiment, the outer surfaces of expandable bushing 900 are coated with a thermal interface material (not shown). The thermal interface material fills imperfections in the outer surfaces of expandable bushing 900 to create a thermal interface with a lower thermal impedance. In one embodiment, a thermal interface material is TIC-4000, commercially available from Bergquist located in Chanhassen, Minn., and is applied in a striped pattern to expandable bushing 900.

While the invention has been described in terms of various specific embodiments, those skilled in the art will recognize that the invention can be practiced with modification within the spirit and scope of the claims.

What is claimed is:

1. A method for forming a heatsink, the method comprising:
   forming a first hole through a thermo pyrolytic graphite (TPG) element, the first hole being configured to be complementary to an expandable bushing;
   layering a metal material comprising a metal fin assembly over the TPG element;
   forming a second hole through the metal material the second hole being larger than the first hole;
   inserting the bushing into the second hole in the metal-material and the first hole in the TPG element;
   inserting a fastener through the bushing and the second and first holes; and
   securing the fastener thereby expanding the bushing against the TPG element at the first hole, the expanded fastener being spaced from the metal material at the second hole, the fastener fixing the metal material to the TPG element.

2. A method in accordance with claim 1, wherein the metal material being selected from the group consisting of aluminum, copper, and combinations thereof.

3. A method in accordance with claim 1, wherein the metal material comprises a conduction-cooled heatframe.

4. A method in accordance with claim 1, further comprising applying a metal-based coating material to the surface of the TPG element prior to installing the bushing.

* * * * *